United States Patent
Oikawa et al.

(10) Patent No.: US 11,534,805 B2
(45) Date of Patent: Dec. 27, 2022

(54) CLEANING METHOD AND PROCESSING APPARATUS

(71) Applicant: Tokyo Electron Limited, Tokyo (JP)

(72) Inventors: Masami Oikawa, Iwate (JP); Tomoya Hasegawa, Iwate (JP); Koji Sasaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/411,372

(22) Filed: Aug. 25, 2021

(65) Prior Publication Data

US 2022/0062958 A1    Mar. 3, 2022

(30) Foreign Application Priority Data

Aug. 28, 2020   (JP) .............................. JP2020-144871

(51) Int. Cl.
*B08B 9/093*    (2006.01)
*B08B 13/00*    (2006.01)

(52) U.S. Cl.
CPC .............. *B08B 9/093* (2013.01); *B08B 13/00* (2013.01); *B08B 2209/08* (2013.01)

(58) Field of Classification Search
CPC ...... B08B 9/093; B08B 13/00; B08B 2209/08
See application file for complete search history.

(56) References Cited

U.S. PATENT DOCUMENTS

| 2006/0042544 | A1* | 3/2006 | Hasebe | C23C 16/4405 |
| | | | | 134/1 |
| 2015/0368794 | A1* | 12/2015 | Morita | C23C 16/4412 |
| | | | | 118/712 |
| 2021/0032746 | A1* | 2/2021 | Koo | H01J 37/32862 |
| 2021/0104421 | A1* | 4/2021 | Oikawa | H01L 21/67103 |
| 2022/0062958 | A1* | 3/2022 | Oikawa | C23C 16/402 |
| 2022/0223404 | A1* | 7/2022 | Oikawa | H01L 21/02057 |

FOREIGN PATENT DOCUMENTS

JP    2006-066540 A    3/2006

* cited by examiner

*Primary Examiner* — Sharidan Carrillo
(74) *Attorney, Agent, or Firm* — Venjuris, P.C.

(57) ABSTRACT

A cleaning method for removing a film deposited in a processing container includes: executing a cleaning of a processing container by supplying a cleaning gas to the processing container while increasing a pressure in the processing container in a stepwise manner at a plurality of time points, thereby removing a film deposited in the processing container; and detecting an end point of the cleaning based on time-dependent data of a concentration of a predetermined gas generated during the execution of the cleaning, for each pressure of the plurality of time points.

12 Claims, 5 Drawing Sheets

CLEANING METHOD AND PROCESSING APPARATUS

CROSS-REFERENCE TO RELATED APPLICATIONS

This application is based on and claims priority from Japanese Patent Application No. 2020-144871 filed on Aug. 28, 2020 with the Japan Patent Office, the disclosure of which is incorporated herein in its entirety by reference.

TECHNICAL FIELD

The present disclosure relates to a cleaning method and a processing apparatus.

BACKGROUND

In a processing apparatus used for a semiconductor process, when a film is formed on a substrate, the film is also deposited inside the apparatus. Thus, in the processing apparatus, a cleaning process is performed for removing the film deposited inside the apparatus, for example, by supplying a cleaning gas into a processing container heated to a predetermined temperature (see, e.g., Japanese Patent Laid-Open Publication No. 2006-066540). In Japanese Patent Laid-Open Publication No. 2006-066540, the time for cleaning the processing apparatus is managed by measuring the concentration of a predetermined gas contained in the gas discharged from the processing container, and cleaning the inside of the apparatus until the concentration reaches a predetermined concentration.

SUMMARY

According to an aspect of the present disclosure, a cleaning method includes: executing a cleaning of a processing container by supplying a cleaning gas to the processing container while increasing a pressure in the processing container in a stepwise manner at a plurality of tie points, thereby removing a film deposited in the processing container, and detecting an end point of the cleaning based on time-dependent data of a concentration of a predetermined gas generated during the execution of the cleaning, for each pressure of the plurality of time points.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
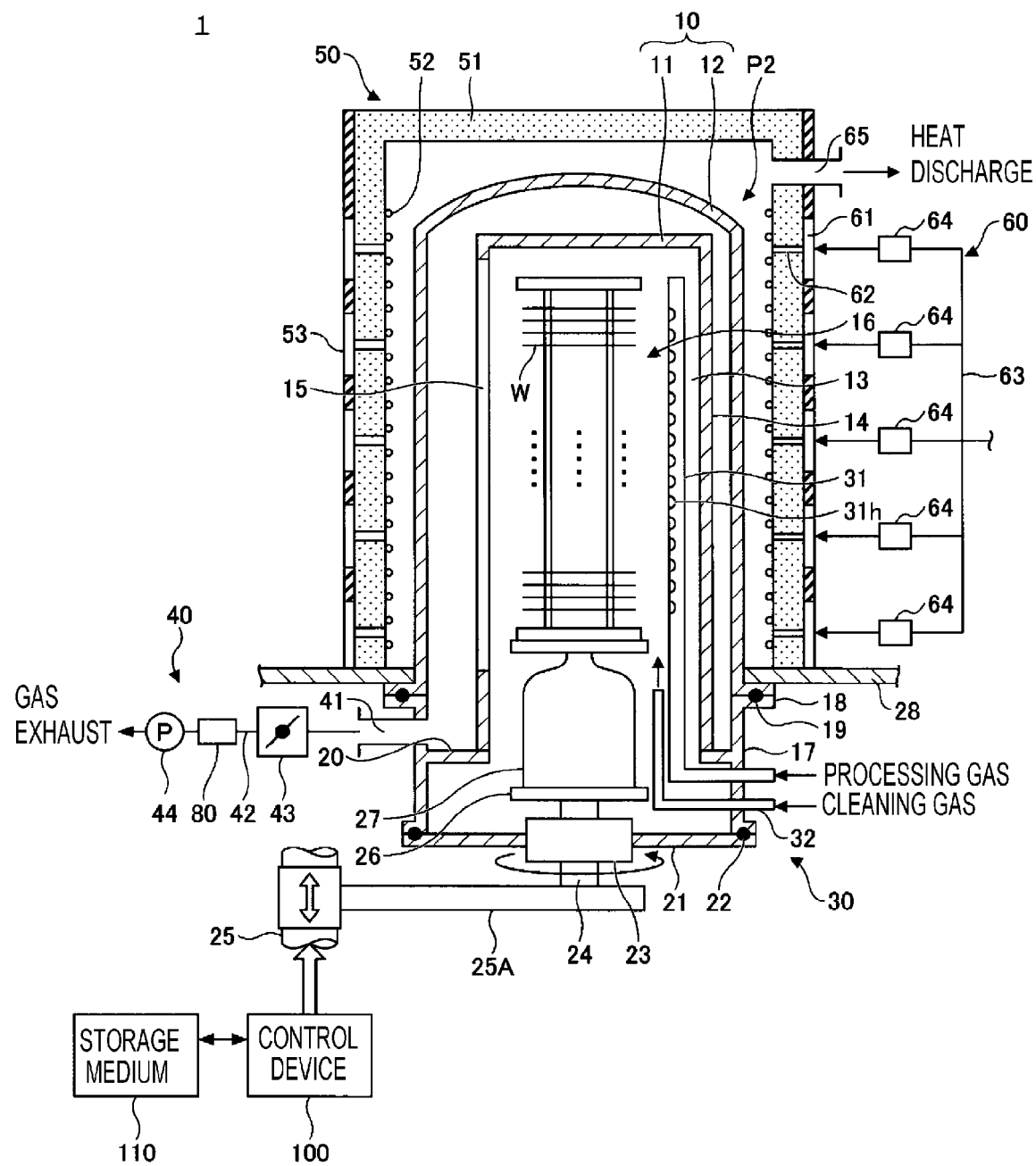
FIG. 1 is a schematic view illustrating an example of a configuration of a processing apparatus according to an embodiment.

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, a non-limiting embodiment of the present disclosure will be described with reference to the accompanying drawings. In the entire drawings, the same or corresponding members or components will be denoted by the same or corresponding reference numerals, and overlapping descriptions thereof will be omitted.

[Etching Reaction]

When a silicon oxide film ($SiO_2$) is etched using hydrogen fluoride (HF) gas at room temperature, water ($H_2O$) is generated as represented by the following reaction formula (1).

$$SiO_2(s)+4HF(g) \rightarrow {}^*SiF_4+2H_2O(l) \quad (1)$$

In addition, the generated water reacts with the hydrogen fluoride gas to generate hydrofluoric acid (HF(aq)), as represented by the following reaction formula (2).

$$HF(g)+H_2O(l) \rightarrow {}^*HF(aq) \quad (2)$$

Further, the hydrofluoric acid etches the silicon oxide film, as represented by the following reaction formula (3).

$$SiO_2(s)+4HF(aq) \rightarrow {}^*SiF_4+2H_2O(l) \quad (3)$$

The reaction rate of the reaction formula (1) above is very small, as compared with the reaction rates of the reaction formulas (2) and (3). Thus, the etching reaction of the silicon oxide film with the hydrogen fluoride gas at the room temperature becomes the reaction form where the generation of water ($H_2O$) is the key to the etching reaction. That is, from the viewpoint of the vapor pressure, the etching reaction is largely affected by the temperature during the etching.

However, when a cleaning process is performed for removing a film deposited inside a processing container at or near the room temperature, it may be difficult to control the temperatures inside processing containers of all apparatuses to the same temperature, due to differences in apparatuses (e.g., an installation environment and a cooling capacity). As a result, the etching rate changes due to the difference in temperature of the processing container, which may cause an over-etching or a film residue.

The inventors of the present disclosure have found out that the reaction for removing the deposited film is progressed as the pressure in the processing container increases, and the reaction for removing the deposited film is progressed again by increasing the pressure even when the reaction for removing the deposited film is stopped at a certain pressure. Further, the inventors of the present disclosure have found out a technique of executing a cleaning by increasing the pressure in the processing container in a stepwise manner, and detecting the end point of the cleaning by monitoring time-dependent data of the concentration of a gas generated during the execution of the cleaning, for each pressure. Detailed descriptions will be made hereinafter.

[Processing Apparatus]

An example of a configuration of a processing apparatus according to an embodiment will be described with reference to FIG. 1. As illustrated in FIG. 1, a processing apparatus 1 includes, for example, a processing container 10, a gas supply 30, an exhaust unit 40, a heater 50, a cooler 60, a gas concentration sensor 80, and a control device 100.

The processing container 10 accommodates a semiconductor wafer (hereinafter referred to as a "wafer W") which is a substrate. The processing container 10 includes a cylindrical inner tube 11 opened at the lower end thereof and having a ceiling, and a cylindrical outer tube 12 opened at the lower end thereof and having a ceiling that covers the external side of the inner tube 11. The inner tube 11 and the outer tube 12 are formed of a heat resistant material such as quartz, and are coaxially arranged to form a double-tube structure.

The ceiling of the inner tube 11 is, for example, flat. An accommodation portion 13 is formed on one side of the inner tube 11 to accommodate a gas nozzle along the longitudinal (vertical) direction of the inner tube 11. For example, a portion of the side wall of the inner tube 11 projects outward to form a convex portion 14, and the inside of the convex portion 14 serves as the accommodation portion 13.

A rectangular opening 15 is formed in the opposite side wall of the inner tube 11 along the longitudinal (vertical) direction of the side wall to face the accommodation portion 13.

The opening 15 is a gas exhaust port formed to exhaust a gas inside the inner tube 11. The opening 15 extends vertically to have the length which is the same as or longer than the length of a wafer boat 16.

The lower end of the processing container 10 is supported by a cylindrical manifold 17 formed of, for example, stainless steel. A flange 18 is formed on the upper end of the manifold 17, and the lower end of the outer tube 12 is supported on the flange 18. A sealing member 19 such as an O-ring is interposed between the flange 18 and the lower end of the outer tube 12 to keep the inside of the outer tube 12 in an airtight state.

An annular support 20 is provided on the inner wall of an upper portion of the manifold 17, and the lower end of the inner tube 11 is supported on the support 20. A lid 21 is airtightly attached to an opening of the lower end of the manifold 17 via a sealing member 22 such as an O-ring, and airtightly seals the opening of the lower end of the processing container 10, that is, the opening of the manifold 17. The lid 21 is formed of, for example, stainless steel. The lid 21 is formed of, for example, stainless steel.

A rotating shaft 24 is provided to penetrate the center of the lid 21 to rotatably support the wafer boat 16 via a magnetic fluid sealing unit 23. The lower portion of the rotating shaft 24 is rotatably supported by an arm 25A of a lifting mechanism 25 that includes a boat elevator.

A rotating plate 26 is provided on the upper end of the rotating shaft 24, and the wafer boat 16 that holds wafers W is placed on the rotating plate 26 via a heat reserving base 27 made of quartz. Accordingly, by moving the lifting mechanism 25 up and down, the lid 21 and the wafer boat 16 are moved up and down in an integrated form, such that the wafer boat 16 may be inserted into and separated from the processing container 10. The wafer boat 16 may be accommodated in the processing container 10, and holds a plurality of wafers W in a shelf shape at a predetermined interval.

The gas supply 30 is provided in the manifold 17. The gas supply 30 introduces a predetermined gas such as a processing gas, a cleaning gas or a purge gas into the inner tube 11. The gas supply 30 includes gas nozzles 31 and 32.

The gas nozzle 31 is made of, for example, quartz, is provided in the inner tube 11 along the longitudinal direction of the inner tube 11, and is supported such that the base end thereof is bent into an L shape to penetrate the manifold 17. A plurality of gas holes 31$h$ is formed in the gas nozzle 31 at a predetermined interval along the longitudinal direction of the gas nozzle 31, and a gas is discharged in the horizontal direction from the gas holes 31$h$. For example, the predetermined interval is set to be the same as the interval between the wafers W supported by the wafer boat 16. The position of each gas hole 31$h$ in the height direction is set such that the gas hole 3$h$ is positioned in the middle between the wafers W which are adjacent to each other in the vertical direction, and a gas may be supplied to the space between the wafers W. The gas nozzle 31 supplies, for example, a processing gas or a purge gas, and supplies the processing gas or the purge gas into the processing container 10 as necessary while controlling the flow rate thereof. The processing gas is selected according to a type of a film to be formed. For example, when a silicon oxide film is formed, a silicon-containing gas such as dichlorosilane (DCS) gas and an oxidizing gas such as ozone ($O_3$) gas may be used as the processing gas. The purge gas may be, for example, nitrogen ($N_2$) gas or argon (Ar) gas.

The gas nozzle 32 is made of, for example, quartz, is provided at a lower portion inside the inner tube 11 along the longitudinal direction of the inner tube 11, and is supported such that the base end thereof is bent into an L shape to penetrate the manifold 17. The gas nozzle 32 is opened at the tip thereof, and discharges a gas upward from the opening. The gas nozzle 32 supplies, for example, a cleaning gas or a purge gas, and supplies the cleaning gas or the purge gas into the processing container 10 as necessary while controlling the flow rate thereof. The cleaning gas is selected according to a type of a film to be formed inside the processing container 10. For example, when a film to be formed inside the processing container 10 is a silicon oxide film, for example, fluorine-containing gas such as hydrogen fluoride (HF) gas, fluorine ($F_2$) gas, chlorine trifluoride ($ClF_3$) gas or nitrogen trifluoride ($NF_3$) gas may be used as the processing gas.

The gas supply 30 may be configured to supply the processing gas, the cleaning gas, and the purge gas into the processing container 10 from one gas nozzle, and the number of gas nozzles is not limited to the example of FIG. 1.

The exhaust unit 40 exhausts a gas discharged from the inside of the inner tube 11 through the opening 15 and discharged from a gas outlet 41 through a space P1 between the inner tube 11 and the outer tube 12. The gas outlet 41 is formed in the upper side wall of the manifold 17 above the support 20. An exhaust passage 42 is connected to the gas outlet 41. A pressure regulating valve 43 and a vacuum pump 44 are provided in this order in the exhaust passage 42, such that the inside of the processing container 10 may be exhausted.

The heater 50 is provided around the processing container 10. The heater 50 is provided, for example, on a base plate 28. The heater 50 heats the wafers W inside the processing container 10. The heater 50 includes, for example, a cylindrical heat insulator 51. The heat insulator 51 is formed mainly of silica and alumina. While the heater 50 is not particularly limited as long as the wafers W inside the processing container 10 may be heated, the heater 50 may be, for example, an infrared heater that radiates infrared rays to heat the processing container 10. A linear heat generator 52 is provided on the inner periphery of the heat insulator 51 in a spiral or meandering shape. The heat generator 52 is configured such that the temperature of each of a plurality of zones obtained by dividing the heater 50 in the height direction is controllable. The heat generator 52 is held on the inner wall surface of the heat insulator 51 via a holding member (not illustrated). However, a concave portion may be formed in the inner wall surface of the heat insulator 51, and the heat generator 52 may be accommodated in the concave portion.

In order to maintain the shape of the heat insulator 51 and reinforce the heat insulator 51, the outer periphery of the heat insulator 51 is covered with an outer skin 53 made of a metal such as stainless steel. Further, in order to suppress the influence of heat on the outside of the heater 50, the outer periphery of the outer skin 53 is covered with a water cooling jacket (not illustrated).

The cooler 60 cools the wafers W inside the processing container 10 by supplying a cooling fluid toward the processing container 10. The cooling fluid may be, for example, air. The cooler 60 supplies the cooling fluid toward the processing container 10, for example, when rapidly lowering the temperature of the wafers W after a heat processing. Further, the cooler 60 supplies the cooling fluid toward the inside of the processing container 10, for example, during a cleaning process for removing a deposited film inside the processing container 10. The cooler 60 includes a fluid flow path 61, a spout hole 62, a distribution flow path 63, a flow rate regulator 64, and a heat exhaust port 65.

A plurality of fluid flow paths 61 is formed in the height direction between the heat insulator 51 and the outer skin 53. For example, each fluid flow path 61 is formed on the external side of the heat insulator 51 along the circumferential direction of the heat insulator 51.

The spout hole 62 is formed to penetrate the heat insulator 51 from each fluid flow path 61, and spouts the cooling fluid into a space P2 between the outer tube 12 and the heat insulator 51.

The distribution flow path 63 is provided outside the outer skin 53, and distributes and supplies the cooling fluid to each fluid flow path 61.

The flow rate regulator 64 is disposed in the middle of the distribution flow path 63, and regulates the flow rate of the cooling fluid supplied to the fluid flow path 61.

The heat exhaust port 65 is provided above the plurality of spout holes 62, and discharges the cooling fluid supplied into the space P2 to the outside of the processing apparatus 1. The cooling fluid discharged to the outside of the processing apparatus 1 is cooled by, for example, a heat exchanger, and supplied again to the distribution flow path 63. The cooling fluid discharged to the outside of the processing apparatus 1 may be discharged without being reused.

A gas concentration sensor 70 is provided in the exhaust passage 42. The gas concentration sensor 80 measures the concentration of a predetermined gas which is contained in the gas flowing through the exhaust passage 42, by using the property of absorbing a unique wavelength according to a type of gas. The gas concentration sensor 80 may be, for example, a non-dispersive infrared (NDIR) sensor. The gas concentration sensor 80 may be provided at a place separated from the exhaust passage 42, as long as the gas concentration sensor 80 is able to measure the concentration of the gas generated during an execution of a cleaning method to be described later.

The control device 100 controls the operation of the processing apparatus 1. The control device 100 may be, for example, a computer. A storage medium 110 stores a computer program for performing the entire operation of the processing apparatus 1. The storage medium 110 may be, for example, a flexible disk, a compact disk, a hard disk, a flash memory, or a DVD.

[Cleaning Method]

An example of a cleaning method according to an embodiment will be described with reference to FIG. 2. The cleaning method of the embodiment is a method of removing a deposited film that adheres to the inside of the processing container 10 when a thin film is formed on the wafers W in the processing apparatus 1. The cleaning method of the embodiment is performed, for example, in a state where no wafer exists in the processing container 10. The cleaning method of the embodiment may be performed, for example, in a state where a wafer such as a dummy wafer exists in the processing container 10.

In step S11, the control device 100 controls each component of the processing apparatus 1, to execute the cleaning process for removing the deposited film that adheres to the inside of the processing container 10 in a state where the pressure in the processing container 10 is adjusted to a certain pressure Ps. For example, the control device 100 controls the heater 50 and the cooler 60, to cool the temperature inside the processing container 10 to room temperature or a temperature near the room temperature. Further, the control device 100 supplies the cleaning gas into the processing container 10 from the gas nozzle 32, and simultaneously, controls the exhaust unit 40 to adjust the pressure in the processing container 10 to the certain pressure Ps. The pressure in the processing container 10 may be, for example, a set pressure that is specified by a recipe or the like. Further, the pressure in the processing container 10 may be, for example, a pressure detected by a pressure sensor (not illustrated) attached to the processing container 10.

In step S12, the control device 100 determines whether a detection value of the gas concentration sensor 80 satisfies a predetermined condition. For example, when time-dependent data of the detection value of the gas concentration sensor 80 at the certain pressure Ps falls below a threshold value after exceeding the threshold value, the control device 100 determines that the detection value of the gas concentration sensor 80 satisfies the predetermined condition. Further, for example, when the time-dependent data of the detection value of the gas concentration sensor 80 at the certain pressure Ps increases and then turns to decrease without exceeding the threshold value, the control device 100 determines that the detection value of the gas concentration sensor 80 does not satisfy the predetermined condition. Further, for example, when the time-dependent data of the detection value of the gas concentration sensor 80 at the certain pressure Ps does not exceed the threshold value within a set time, the control device 100 determines that the detection value of the gas concentration sensor 80 does not satisfy the predetermined condition. The threshold value and the set time are determined through, for example, preliminary experiments.

When it is determined in step S12 that the detection value of the gas concentration sensor 80 satisfies the predetermined condition, the control device 100 determines that the removal of the deposited film in the processing container 10 has not been completed, and causes the process to proceed to step S13. Meanwhile, when it is determined in step S12 that the detection value of the gas concentration sensor 80 does not satisfy the predetermined condition, the control device 100 determines that the removal of the deposited film in the processing container 10 has been completed, and causes the process to proceed to step S14.

In step S13, the control device 100 increases the certain pressure Ps by a predetermined pressure P1 (Ps=Ps+P1).

In step S14, the control device 100 controls each component of the processing apparatus 1 to execute a purge process for exhausting the gas that remains in the processing container 10. For example, the control device 100 exhausts the gas that remains in the processing container 10, by repeating a cycle that includes exhausting the inside of the processing container 10 by the exhaust unit 40 and supplying a purge gas into the processing container 10 by the gas supply 30. The control device 100 ends the process after executing step S14.

Figure 2:
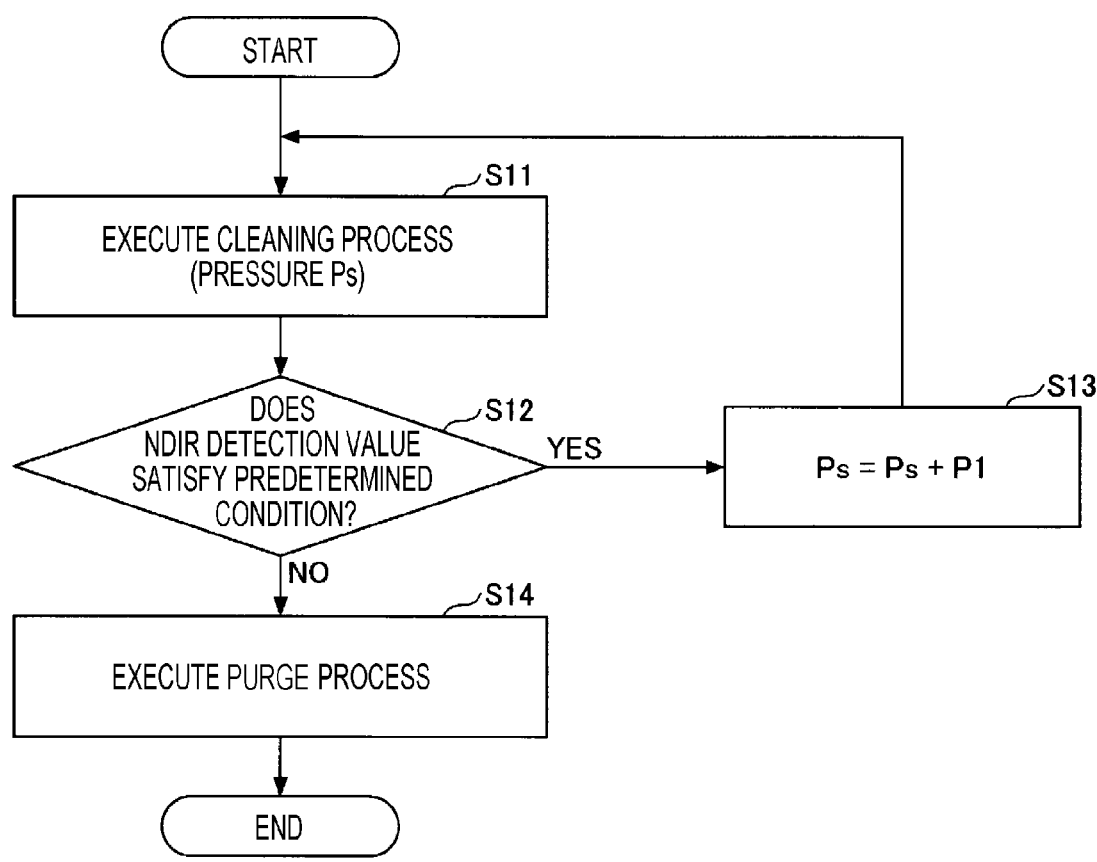
FIG. 2 is a flowchart illustrating an example of a cleaning method according to an embodiment.
Figure 3A:
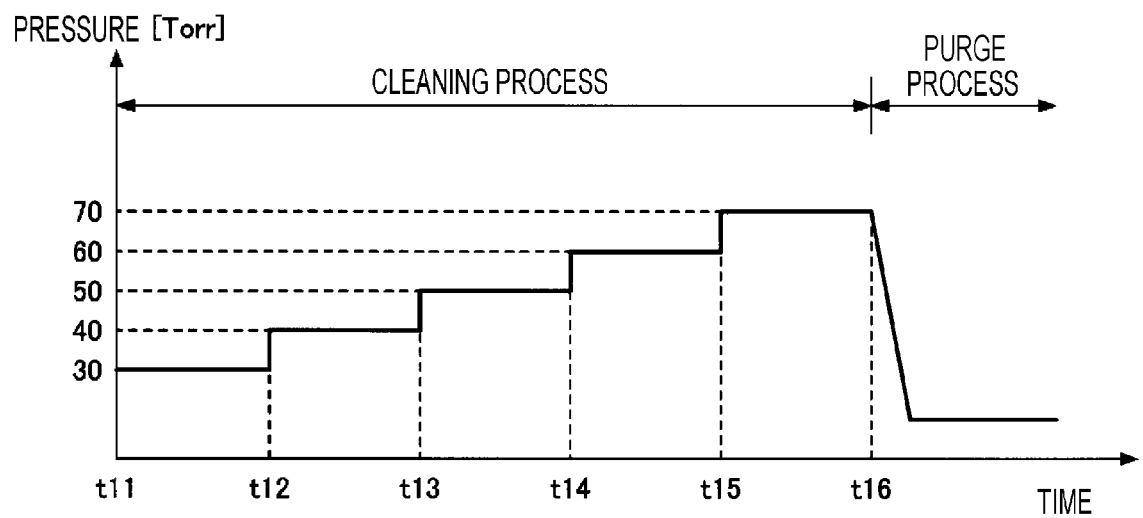
FIGS. 3A and 3B are views illustrating examples of time-dependent variations of a pressure in a processing container and a detection value of a non-dispersive infrared (NDIR) sensor.
Figure 3B:
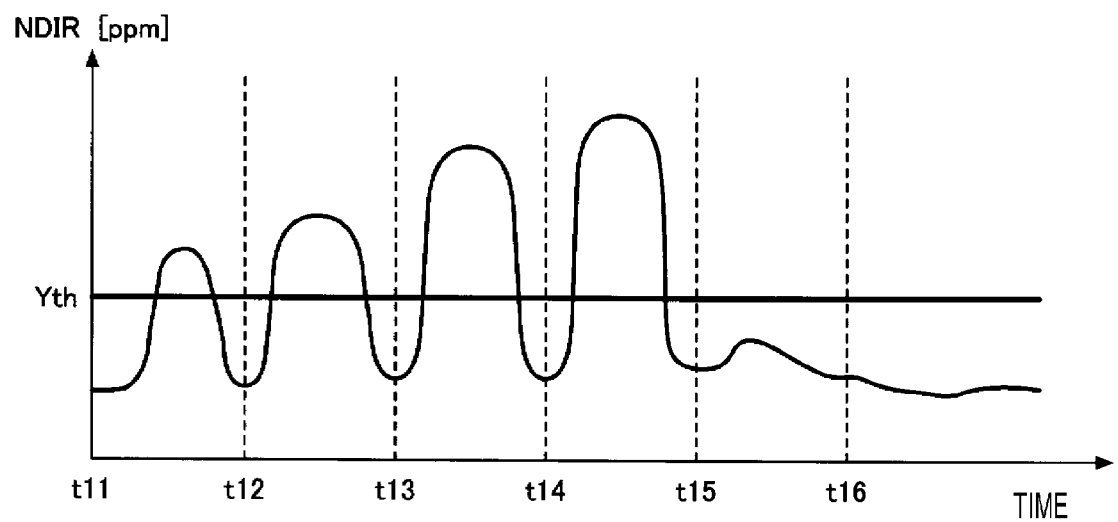

With reference to FIGS. 3A and 3B, descriptions will be made on examples of time-dependent variations of the pressure in the processing container 10 and the detection value of NDIR when the cleaning method illustrated in FIG. 2 is executed. In the following descriptions, it is assumed that the deposited film is a $SiO_2$ film, the cleaning gas is HF gas, the gas concentration sensor 80 is an NDIR sensor, and an object to be detected by the NDIR sensor is $SiF_4$.

FIG. 3A is a view illustrating the time-dependent variation of the pressure in the processing container 10. In FIG. 3A, the horizontal axis represents time, and the vertical axis represents the pressure [Torr] in the processing container 10. FIG. 3B is a view illustrating the time-dependent variation of the detection value of the NDIR sensor. In FIG. 3B, the horizontal axis represents time, and the vertical axis represents the detection value [ppm] of the NDIR sensor.

First, at a timing t11, in a state where the pressure in the processing container 10 is adjusted to 30 Torr (4.0 kPa), the control device 100 supplies the HF gas into the processing container 10, and starts the cleaning process for removing the deposited film that adheres to the inside of the processing container 10 (step S11). After starting the cleaning process, the control device 100 maintains the pressure in the processing container 10 to be constant. Further, the control device 100 monitors the detection value (concentration of $SiF_4$) of the NDIR sensor during the execution of the cleaning process (step S12).

Subsequently, at a timing t12, the control device 100 determines that the detection value of the NDIR sensor satisfies the predetermined condition, since the time-dependent data of the detection value of the NDIR sensor at 30 Torr exceeds a threshold value Yth and then falls below the threshold value Yth. (step S12). Then, at the timing t12, the control device 100 changes the pressure in the processing container 10 from 30 Torr to 40 Torr (5.3 kPa) (step S13), and continues the cleaning process (step S11). Further, the control device 100 monitors the detection value of the NDIR sensor during the execution of the cleaning process (step S12).

Subsequently, at a timing t13, the control device 100 determines that the detection value of the NDIR sensor satisfies the predetermined condition, since the time-dependent data of the detection value of the NDIR sensor at 40 Torr exceeds the threshold value Yth and then falls below the threshold value Yth (step S12). Then, at the timing t13, the control device 100 changes the pressure in the processing container 10 from 40 Torr to 50 Torr (6.7 kPa) (step S13), and continues the cleaning process (step S11). Further, the control device 100 monitors the detection value of the NDIR sensor during the execution of the cleaning process (step S12).

Subsequently, at a timing t14, the control device 100 determines that the detection value of the NDIR sensor satisfies the predetermined condition, since the time-dependent data of the detection value of the NDIR sensor at 50 Torr exceeds the threshold value Yth and then falls below the threshold value Yth (step S12). Then, at the timing t14, the control device 100 changes the pressure in the processing container 10 from 50 Torr to 60 Torr (8.0 kPa) (step S13), and continues the cleaning process (step S11). Further, the control device 100 monitors the detection value of the NDIR sensor during the execution of the cleaning process (step S12).

Subsequently, at a timing t15, the control device 100 determines that the detection value of the NDIR sensor satisfies the predetermined condition, since the time-dependent data of the detection value of the NDIR sensor at 60 Torr exceeds the threshold value Yth and then falls below the threshold value Yth (step S12). Then, at the timing t15, the control device 100 changes the pressure in the processing container 10 from 60 Torr to 70 Torr (9.3 kPa) (step S13), and continues the cleaning process (step S11). Further, the control device 100 monitors the detection value of the NDIR sensor during the execution of the cleaning process (step S12).

Subsequently, the control device 100 determines that the detection value of the NDIR sensor does not satisfy the predetermined condition, since the detection value of the NDIR sensor at 70 Torr increases and then turns to decrease without exceeding the threshold value Yth (step S12). Then, at a timing t16, the control device 100 determines that the removal of the deposited film in the processing container 10 has been completed, and starts the purge process for exhausting the gas that remains in the processing container 10 (step S14). Then, the control device 100 ends the cleaning method of the embodiment after executing the purge process for a predetermined time.

As described above, according to the cleaning method illustrated in FIGS. 2, 3A and 3B, the cleaning is executed by increasing the pressure in the processing container 10 in the stepwise manner, and the end point of the cleaning is detected based on time-dependent data of the concentration of a gas generated during the execution of the cleaning, for each pressure. Thus, the end point of the cleaning may be detected even in the cleaning process performed at or near the room temperature that falls within a temperature range in which the temperature control is difficult. As a result, the overetching or the film residue may be suppressed.

Further, according to the cleaning method illustrated in FIGS. 2, 3A, and 3B, since the temperature inside the processing container 10 is not monitored, the cleaning method may be applied to an apparatus equipped with no temperature sensor. Further, the cleaning method may also be applied to a deposited film of which etching rate is unclear.

In the example above, descriptions are made on a case where the pressure in the processing container 10 is increased by a constant increment. However, the present disclosure is not limited thereto. For example, the pressure increment in the processing container 10 may be gradually increased or gradually decreased. That is, the pressure in the processing container 10 may be increased by different increments. Specifically, the increments of the pressure in the processing container 10 at the timings t12, t13, t14, and t15 may be 10 Torr (1.3 kPa), 20 Torr (2.7 kPa), 30 Torr (4.0 kPa), and 40 Torr (5.3 kPa), respectively.

Figure 4:
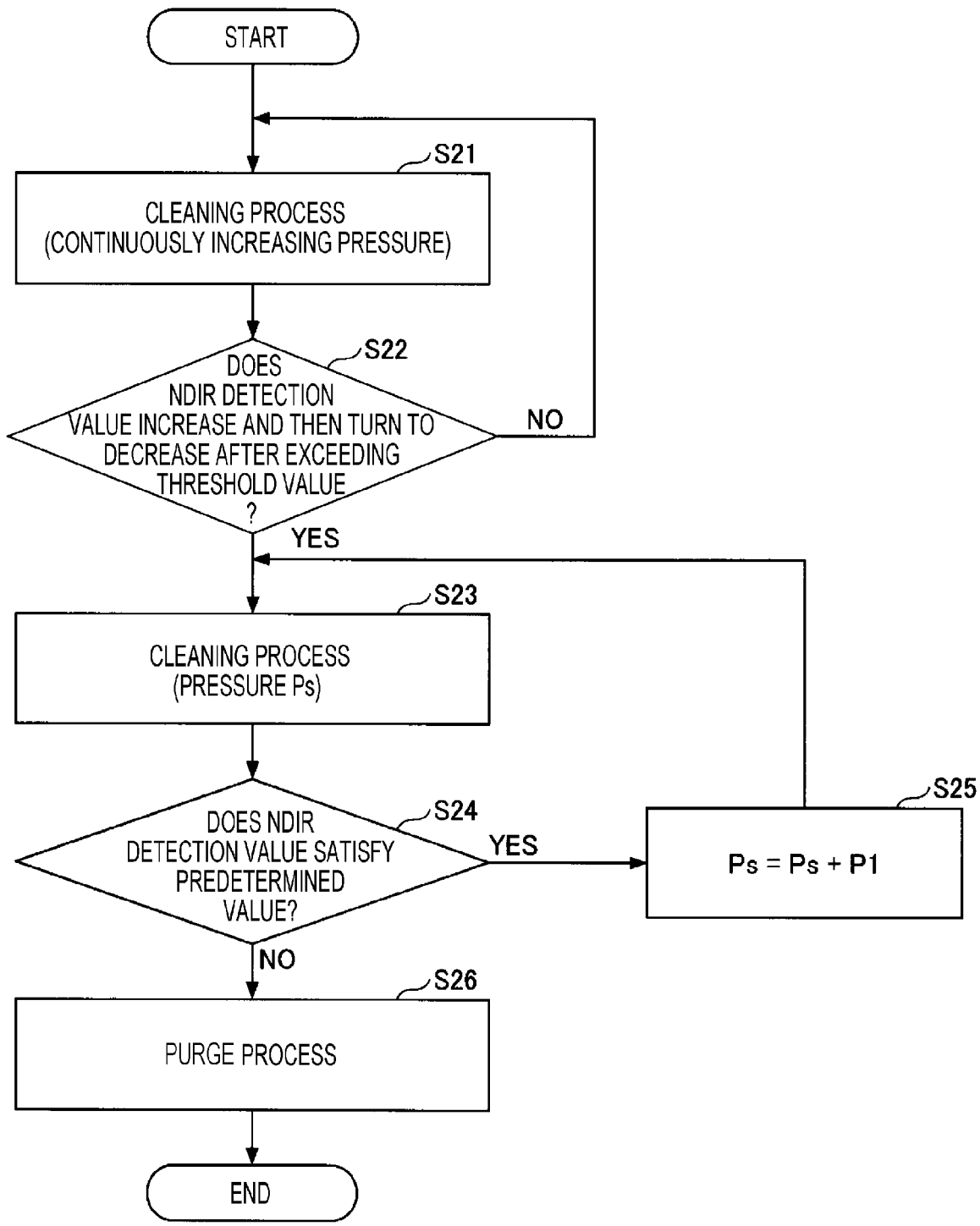
FIG. 4 is a flowchart illustrating another example of the cleaning method according to an embodiment.

With reference to FIG. 4, another example of the cleaning method according to the embodiment will be described. The cleaning method illustrated in FIG. 4 further includes a step of continuously increasing the pressure in the processing container 10 while supplying the cleaning gas into the processing container 10, prior to steps S 11 to S14 of the cleaning method illustrated in FIG. 2. Detailed descriptions will be made hereinafter.

In step S21, the control device 100 controls each component of the processing device 1, to execute the cleaning process for removing the deposited film that adheres to the inside of the processing container 10, while continuously increasing the pressure in the processing container 10. For example, the control device 100 controls the heater 50 and the cooler 60, to cool the temperature inside the processing container 10 to the room temperature or a temperature near the room temperature. Further, the control device 100 supplies the cleaning gas into the processing container 10 from the gas nozzle 32, and simultaneously, controls the exhaust unit 40 to continuously increase the pressure in the processing container 10.

In step S22, the control device 100 determines whether the detection value of the gas concentration sensor 80 increases and then turns to decrease after exceeding the threshold value. When it is determined in step S22 that the detection value of the gas concentration sensor 80 increases and then turns to decrease after exceeding the threshold value, the control device 100 causes the process to proceed to step S23. Meanwhile, when it is determined in step S22 that the detection value of the gas concentration sensor 80 does not increase and then turn to decrease after exceeding the threshold value, the control device 100 returns the process to step S21.

In step S23, the control device 100 controls each component of the processing apparatus 1 to execute the cleaning process for removing the deposited film that adheres to the inside of the processing container 10 in a state where the pressure in the processing container 10 is adjusted to the certain pressure Ps. For example, the control device 100 controls the heater 50 and the cooler 60, to cool the temperature inside the processing container 10 to the room temperature or a temperature near the room temperature. Further, the control device 100 supplies the cleaning gas into the processing container 10 from the gas nozzle 32, and simultaneously, controls the exhaust unit 40 to adjust the pressure in the processing container 10 to the certain pressure Ps. The certain pressure Ps is determined based on, for example, the pressure in the processing container 10 when the detection value of the gas concentration sensor 80 turns to decrease in step S22. The certain pressure Ps may be, for example, the pressure in the processing container 10 when the detection value of the gas concentration sensor 80 turns to decrease in step S22. Further, the certain pressure Ps may be, for example, a pressure higher than the pressure in the processing container 10 when the detection value of the gas concentration sensor 80 turns to decrease in step S22.

Steps S24 to S26 are the same as steps S12 to S14 illustrated in FIGS. 3A and 3B.

Figure 5A:
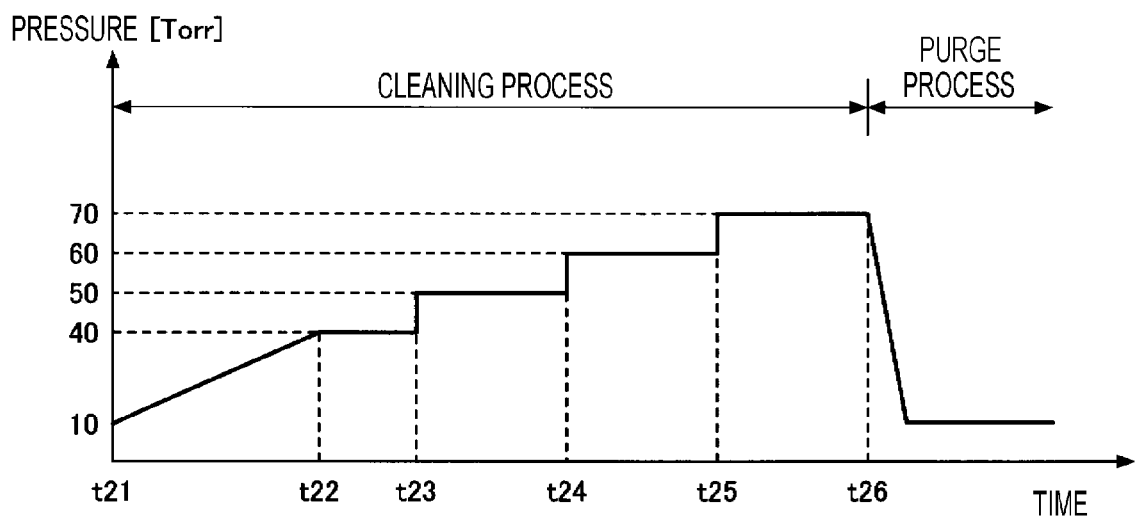
FIGS. 5A and 5B are views illustrating other examples of the time-dependent variations of the pressure in the processing container and the detection value of the NDIR sensor.
Figure 5B:
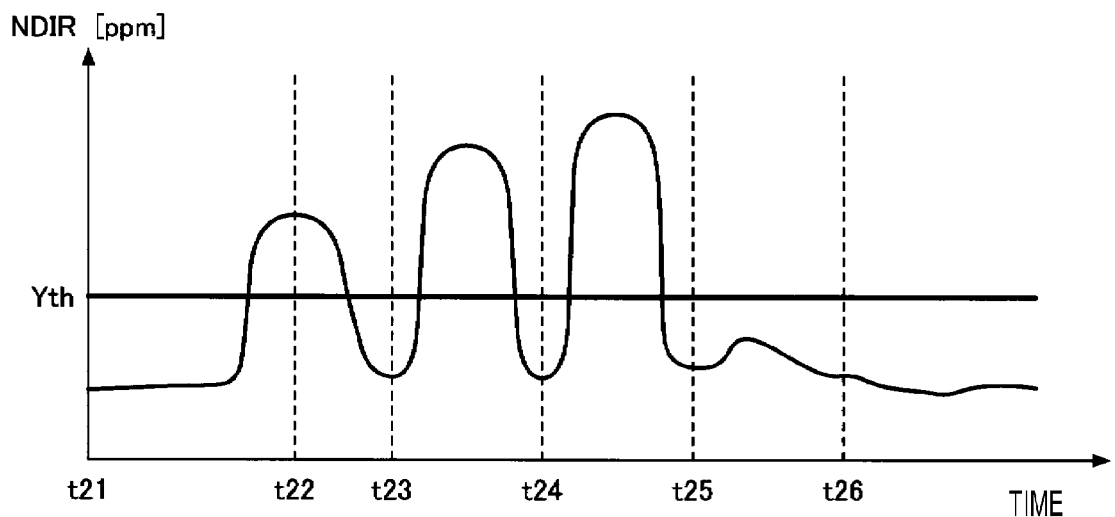

With reference to FIGS. 5A and 5B, descriptions will be made on examples of time-dependent variations of the pressure in the processing container 10 and the detection value of NDIR when the cleaning method illustrated in FIG. 4 is executed. In the following descriptions, it is assumed that the deposited film is a $SiO_2$ film, the cleaning gas is HF gas, the gas concentration sensor 80 is an NDIR sensor, and an object to be detected by the NDIR sensor is $SiF_4$.

FIG. 5A is a view illustrating the time-dependent variation of the pressure in the processing container 10. In FIG. 5A, the horizontal axis represents time, and the vertical axis represents the pressure [Torr] in the processing container 10. FIG. 5B is a view illustrating the time-dependent variation of the detection value of the NDIR sensor. In FIG. 5B, the horizontal axis represents time, and the vertical axis represents the detection value [ppm] of the NDIR sensor.

First, at a timing t21, in a state where the pressure in the processing container 10 is adjusted to 10 Torr (1.3 kPa), the control device 100 supplies the HF gas into the processing container 10, and starts the cleaning process for removing the deposited film that adheres to the inside of the processing container 10 (step S21). After starting the cleaning process, the control device 100 continuously increases the pressure in the processing container 10. Further, the control device 100 monitors the detection value (the concentration of $SiF_4$) of the NDIR sensor during the execution of the cleaning process (step S22).

Subsequently, at a timing t22, the control device 100 determines that the time-dependent data of the detection value of the NDIR sensor increases and then turns to decrease after exceeding the threshold value Yth (step S22). Further, the control device 100 acquires the pressure in the processing container 10 at the timing t22. In the example of FIG. 5A, the pressure in the processing container 10 at the timing t22 is 40 Torr (5.3 kPa).

Then, at the timing t22, in a state where the pressure in the processing container 10 is adjusted to 40 Torr, the control device 100 supplies the HF gas into the processing container 10, and starts the cleaning process for removing the deposited film that adheres to the inside of the processing container 10 (step S23). After starting the cleaning process, the control device 100 maintains the pressure in the processing container 10 to be constant. Further, the control device 100 monitors the detection value of the NDIR sensor during the execution of the cleaning process (step S24).

Subsequently, at a timing t23, the control device 100 determines that the detection value of the NDIR sensor satisfies the predetermined condition, since the time-dependent data of the detection value of the NDIR sensor at 40 Torr falls below the threshold value Yth after exceeding the threshold value Yth (step S24). Then, at the timing t23, the control device 100 changes the pressure in the processing container 10 from 40 Torr to 50 Torr (6.7 kPa) (step S25), and continues the cleaning process (step S23). Further, the control device 100 monitors the detection value of the NDIR sensor during the execution of the cleaning process (step S24).

Subsequently, at a timing t24, the control device 100 determines that the detection value of the NDIR sensor satisfies the predetermined condition, since the time-dependent data of the detection value of the NDIR sensor at 50 Torr falls below the threshold value Yth after exceeding the threshold value Yth (step S24). Then, at the timing t24, the control device 100 changes the pressure in the processing container 10 from 50 Torr to 60 Torr (8.0 kPa) (step S25), and continues the cleaning process (step S23). Further, the control device 100 monitors the detection value of the NDIR sensor during the execution of the cleaning process (step S24).

Subsequently, at a timing t25, the control device 100 determines that the detection value of the NDIR sensor satisfies the predetermined condition, since the time-dependent data of the detection value of the NDIR sensor at 60 Torr falls below the threshold value Yth after exceeding the threshold value Yth (step S24). Then, at the timing t25, the control device 100 changes the pressure in the processing container 10 from 60 Torr to 70 Torr (9.3 kPa) (step S25), and continues the cleaning process (step S23). Further, the control device 100 monitors the detection value of the NDIR sensor during the execution of the cleaning process (step S24).

Subsequently, the control device 100 determines that the detection value of the NDIR sensor does not satisfy the predetermined condition, since the detection value of the NDIR sensor at 70 Torr increases and then turns to decrease without exceeding the threshold value Yth (step S24). Then, at a timing t26, the control device 100 determines that the removal of the deposited film in the processing container 10 has been completed, and starts the purge process for exhausting the gas that remains in the processing container 10 (step S26). Then, the control device 100 ends the cleaning method of the embodiment after executing the purge process for a predetermined time.

As described above, according to the cleaning method illustrated in FIGS. 4, 5A and 5B, the cleaning is executed by increasing the pressure in the processing container 10 in the stepwise manner, and the end point of the cleaning is detected based on time-dependent data of the concentration of a gas generated during the execution of the cleaning, for each pressure. Thus, the end point of the cleaning may be detected even in the cleaning process performed at or near the room temperature that falls within a temperature range in which the temperature control is difficult. As a result, the overetching or the film residue may be suppressed.

Further, according to the cleaning method illustrated in FIGS. 4, 5A, and 5B, since the temperature inside the processing container 10 is not monitored, the cleaning method may be applied to an apparatus equipped with no temperature sensor. Further, the cleaning method may be applied to a deposited film of which etching rate is unclear.

The cleaning method illustrated in FIGS. 4, 5A, and 5B further includes the step of continuously increasing the pressure in the processing container 10 while supplying the cleaning gas into the processing container 10, prior to the step of executing the cleaning by increasing the pressure in the processing container 10 in the stepwise manner. As a result, even in a case where the pressure at which the deposited film is etched is unknown, it is possible to automatically set the starting pressure (initial value) in the step of executing the cleaning by increasing the pressure in the processing container 10 in the stepwise manner. Thus, it is unnecessary to find out the starting pressure through, for example, preliminary experiments.

[Operation of Processing Apparatus]

Descriptions will be made on a film forming process for forming a silicon oxide film on the wafers W, as an example of the operation of the processing apparatus 1.

First, the wafer boat 16 that holes the plurality of wafers W is carried into the processing container 10 by the lifting mechanism 25, and the opening of the lower end of the processing container 10 is airtightly closed and sealed by the lid 21.

Subsequently, the exhaust unit 40 exhausts the inside of the processing container 10 such that the pressure in the processing container 10 becomes a predetermined degree of vacuum, simultaneously, the heater 50 heats the wafers W in the processing container 10 to a predetermined temperature, and the wafer boat 16 is rotated. Subsequently, the gas supply 30 supplies the silicon-containing gas and the oxidizing gas as the processing gas into the processing container 10. As a result, a silicon oxide film is formed on the wafers W.

Subsequently, the supply of the processing gas from the gas supply 30 is stopped, the heating of the wafers W by the heater 50 is stopped, and the rotation of the wafer boat 16 is stopped.

Subsequently, the cooler 60 rapidly lowers the temperature of the wafers W in the processing container 10. Then, after the wafers W in the processing container 10 reach a predetermined temperature or lower, the wafer boat 16 is carried out from the processing container 10 by the lifting mechanism 25, and the film forming process is ended.

Descriptions will be made on a cleaning process for removing a deposited film that includes the silicon oxide film deposited in the processing container 10 by repeating the film forming process, as another example of the operation of the processing apparatus 1. For example, the cleaning process is executed once each time the film forming process is performed multiple times. However, for example, the cleaning process may be executed once each time the film formation process is executed once.

First, in a state where the wafer boat 16 does not exist in the processing container 10, the opening of the lower end of the processing container 10 is airtightly closed and sealed.

Subsequently, the exhaust unit 40 exhausts the inside of the processing container 10 such that the pressure in the processing container 10 becomes the certain pressure Ps, and simultaneously, the cooler 60 cools the inside of the processing container 10 to the room temperature or a temperature near the room temperature. Subsequently, the gas supply 30 supplies the HF gas as the cleaning gas into the processing container 10, to remove the deposited film that includes the silicon oxide film deposited in the processing container 10. At this time, as in the cleaning method described above, the cleaning is executed by increasing the pressure in the processing container 10 in the stepwise manner, and the end point of the cleaning is detected by monitoring time-dependent data of the concentration of a gas generated during the execution of the cleaning, for each pressure. As a result, it is possible to suppress the overetching or the film residue caused from the cleaning process executed at or near the room temperature that falls within the temperature range in which the temperature control is difficult. After the cleaning process is ended, the gas that remains in the processing container 10 is exhausted, by repeating the cycle that includes exhausting the inside of the processing container 10 by the exhaust unit 40 and supplying the purge gas into the processing container 10 by the gas supply 30, and the cleaning is ended.

In the example described above, descriptions are made on a case where the cleaning process is executed in a state where the wafer boat 16 does not exist in the processing container 10. However, the present disclosure is not limited thereto. For example, the cleaning process may be executed in a state where the wafer boat 16 that holds dummy wafers or the like or an empty wafer boat 16 exists in the processing container 10.

In the embodiment described above, the control device 100 is an example of a controller.

While the embodiment described above represents a case where the processing container has a double-tube structure, the present disclosure is not limited thereto. For example, the processing container may have a single tube structure.

While the embodiment described above represents a case where the processing apparatus is an apparatus that supplies a gas from the gas nozzle disposed along the longitudinal direction of the processing container, and exhausts the gas from an opening (slit) provided to face the gas nozzle, the present disclosure is not limited thereto. For example, the processing apparatus may be an apparatus that supplies a gas from a gas nozzle disposed along the longitudinal direction of the wafer boat, and exhausts the gas from an exhaust port disposed above the wafer boat. Further, for example, the processing apparatus may be an apparatus that supplies the processing gas from a gas nozzle disposed at a lower portion of the processing container, and exhausts the gas from an exhaust port disposed at an upper portion of the processing container.

While the embodiment described above represents a case where the processing apparatus is an apparatus that does not use plasma, the present disclosure is not limited thereto. For example, the processing apparatus may be an apparatus that uses plasma such as capacitively coupled plasma (CCP) or inductively coupled plasma (ICP).

While the embodiment described above represents a case where the processing apparatus is a batch type apparatus that processes a plurality of wafers at once, the present disclosure is not limited thereto. For example, the processing apparatus may be a single-wafer type apparatus that processes wafers one by one. For example, the processing apparatus may be a semi-batch type apparatus that processes a plurality of wafers by revolving the wafers placed on a rotating table inside a processing container by the rotating table, and causing the wafers to sequentially pass through a region where a first gas is supplied and a region where a second gas is supplied.

While the embodiment described above represents a case where the substrate is a semiconductor wafer, the present disclosure is not limited thereto. For example, the substrate may be a large-sized substrate for a flat panel display (FPD), a substrate for an organic EL panel, or a substrate for a solar cell.

According to the present disclosure, the end point of a cleaning may be detected.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning method comprising:
executing a cleaning of a processing container by supplying a cleaning gas to the processing container while increasing a pressure in the processing container in a stepwise manner at a plurality of time points, thereby removing a film deposited in the processing container; and
detecting an end point of the cleaning based on time-dependent data of a concentration of a predetermined gas generated during the execution of the cleaning, for each pressure of the plurality of time points.

2. The cleaning method according to claim 1, wherein in the executing the cleaning, the pressure in the processing container is increased to a pressure higher than a current pressure when the time-dependent data at the current pressure falls below a threshold value after exceeding the threshold value.

3. The cleaning method according to claim 1, wherein in the executing the cleaning, the pressure in the processing container is increased by a constant increment.

4. The cleaning method according to claim 1, wherein in the executing the cleaning, the pressure in the processing container is increased by different increments.

5. The cleaning method according to claim 1, further comprising:
purging an inside of the processing container after detecting the end point of the cleaning.

6. The cleaning method according to claim 1, further comprising:
prior to the executing the cleaning, continuously increasing the pressure in the processing container while supplying the cleaning gas into the processing container.

7. The cleaning method according to claim 1, wherein the concentration of the predetermined gas is measured by a nondispersive infrared (NDIR) sensor.

8. The cleaning method according to claim 1, wherein the executing the cleaning is implemented at a room temperature.

9. The cleaning method according to claim 1, wherein the cleaning gas in the executing the cleaning is a fluorine-containing gas.

10. The cleaning method according to claim 2, wherein in the executing the cleaning, the end point of the cleaning is detected when the time-dependent data at the current pressure increases and then decreases without exceeding the threshold value.

11. The cleaning method according to claim 2, wherein in the executing the cleaning, the end point of the cleaning is detected when the time-dependent data at the current pressure does not exceed the threshold value within a set time.

12. The cleaning method according to claim 9, wherein the fluorine-containing gas is a hydrogen fluoride gas.

* * * * *